United States Patent
Cai et al.

(10) Patent No.: US 9,640,523 B2
(45) Date of Patent: May 2, 2017

(54) LATERAL-DIODE, VERTICAL-SCR HYBRID STRUCTURE FOR HIGH-LEVEL ESD PROTECTION

(71) Applicant: Hong Kong Applied Science & Technology Research Institute Company Limited, Hong Kong (HK)

(72) Inventors: Xiaowu Cai, Shenzhen (CN); Beiping Yan, Hong Kong (HK); Zhongzi Chen, Hong Kong (HK)

(73) Assignee: Hong Kong Applied Science and Technology Research Institute Company Limited, Hong Kong (HK)

(*) Notice: Subject to any disclaimer, the term of this patent is extended or adjusted under 35 U.S.C. 154(b) by 0 days.

(21) Appl. No.: 14/847,249

(22) Filed: Sep. 8, 2015

(65) Prior Publication Data
US 2017/0069616 A1    Mar. 9, 2017

(51) Int. Cl.
*H01L 27/02* (2006.01)
*H01L 29/74* (2006.01)
*H01L 29/749* (2006.01)

(52) U.S. Cl.
CPC ........ *H01L 27/0255* (2013.01); *H01L 29/749* (2013.01); *H01L 29/7412* (2013.01)

(58) Field of Classification Search
CPC ............... H01L 29/749; H01L 29/7412; H01L 27/0248; H01L 27/0255; H01L 27/0259; H01L 27/0262
See application file for complete search history.

(56) References Cited

U.S. PATENT DOCUMENTS

| | | | |
|---|---|---|---|
| 5,811,857 A | 9/1998 | Assaderaghi et al. | |
| 6,590,264 B2 | 7/2003 | Ker et al. | |
| 7,394,133 B1 * | 7/2008 | Vashchenko | ........ H01L 27/0262 257/355 |
| 7,880,223 B2 | 2/2011 | Bobde | |

(Continued)

OTHER PUBLICATIONS

"Design of ESD Protection Diodes With Embedded SCR for Differential LNA in a 65-nm CMOS Process", IEEE Transactions on Microwave Theory and Techniques, vol. 62, No. 11, Nov. 2014; pp. 2723-2732.*

(Continued)

*Primary Examiner* — Minh-Loan Tran
*Assistant Examiner* — Farid Khan
(74) *Attorney, Agent, or Firm* — gPatent LLC; Stuart T. Auviney

(57) ABSTRACT

A lateral p-n diode in the center of and surrounded by a vertical Silicon-Controlled Rectifier (SCR) forms an Electro-Static-Discharge (ESD) protection structure. The lateral p-n diode has a cross-shaped P+ diode tap with four rectangles of N+ diode regions in each corner of the cross. A P-well under the P+ diode tap is also an anode of a vertical PNPN SCR that has a deep N-well in a P-substrate. The deep N-well surrounds the lateral diode. Triggering MOS transistors are formed just beyond the four ends of the cross shaped P+ diode tap. Each triggering MOS transistor has N+ regions at the edge of the deep N-well and in the P-substrate that act as the cathode terminals. A deep P+ implant region under the N+ region at the edge of the deep N-well decreases a trigger voltage of the vertical SCR.

20 Claims, 20 Drawing Sheets

(56) References Cited

U.S. PATENT DOCUMENTS

| | | | |
|---|---|---|---|
| 8,704,313 B1 | 4/2014 | Rahim et al. | |
| 9,054,521 B2 | 6/2015 | Huo et al. | |
| 9,230,953 B2* | 1/2016 | Pan | H01L 29/0615 |
| 2003/0080386 A1 | 5/2003 | Ker et al. | |
| 2005/0173727 A1* | 8/2005 | Manna | H01L 27/0262 |
| | | | 257/173 |
| 2005/0224836 A1* | 10/2005 | Tseng | H01L 29/7436 |
| | | | 257/107 |
| 2006/0209478 A1* | 9/2006 | Arai | H01L 27/0262 |
| | | | 361/56 |
| 2006/0232898 A1* | 10/2006 | Morishita | H01L 27/0262 |
| | | | 361/56 |
| 2011/0266624 A1* | 11/2011 | Duvvury | H01L 27/0262 |
| | | | 257/360 |
| 2012/0099229 A1* | 4/2012 | Domanski | H01L 27/0262 |
| | | | 361/56 |
| 2012/0126285 A1* | 5/2012 | Campi, Jr. | H01L 21/823892 |
| | | | 257/173 |
| 2013/0168732 A1 | 7/2013 | Lin et al. | |
| 2013/0285137 A1* | 10/2013 | Pendharkar | H01L 29/87 |
| | | | 257/328 |
| 2014/0167099 A1* | 6/2014 | Mergens | H01L 29/87 |
| | | | 257/109 |

OTHER PUBLICATIONS

Chun-Yu Lin, et al., "Design of ESD protection diodes with embedded SCR for differential LNA in a 65-nm CMOS process", IEEE transactions on microwave, 2014, pp. 2723-2732.

Lee et al., "Novel ESD Protection Structure with Embedded SCR LDMOSfor Smart Power Technology", IEEE 02CH37320, 40th Annual International Reliability Physics Symposium, Dallas, Texas, 2002, pp. 156-161.

Markus P.J. Mergens, et al., "Diode-Triggered SCR (DTSCR) for RF-ESD Protectionof BiCMOS SiGe HBTs and CMOS Ultra-Thin Gate Oxides", SOFICS, International Electron Devices Meeting, 2003.

* cited by examiner

FIG. 4    CROSS-SECTION 102

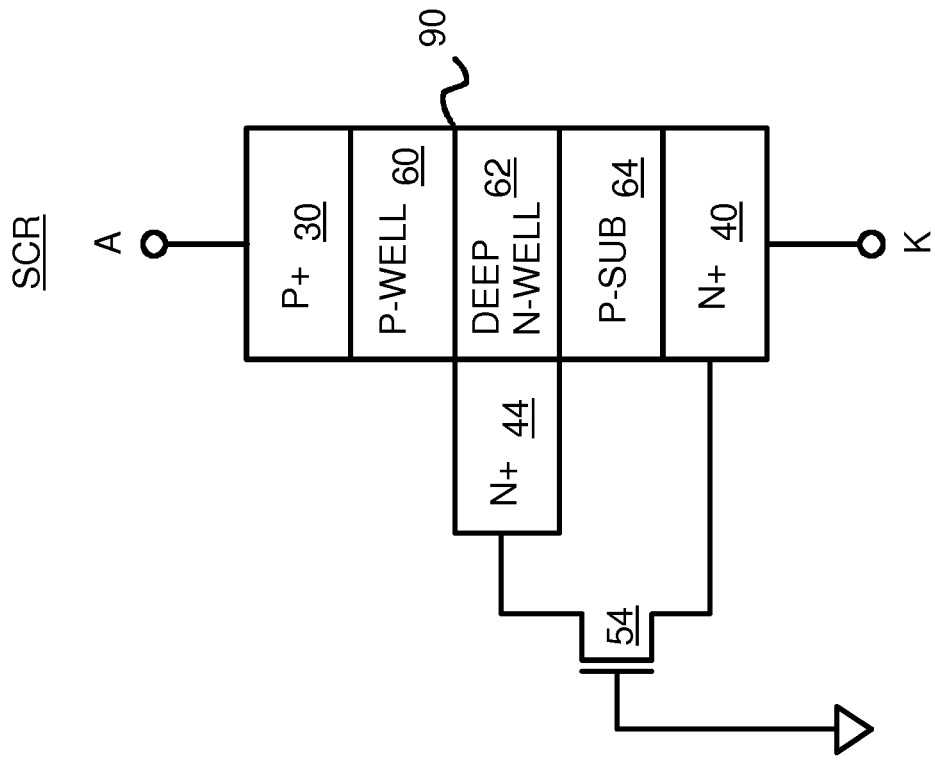
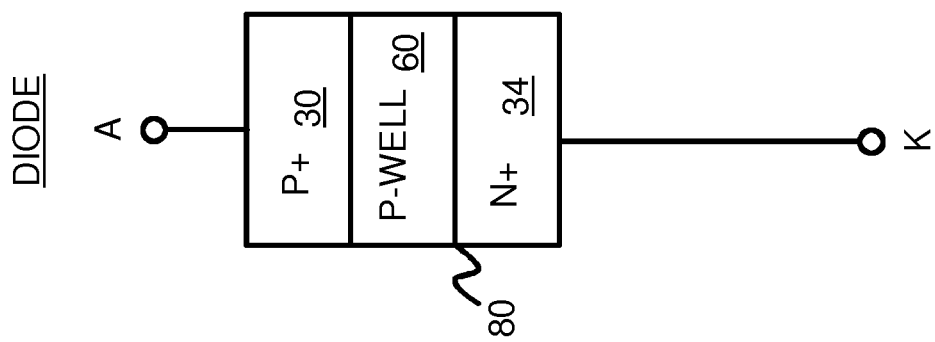
FIG. 5

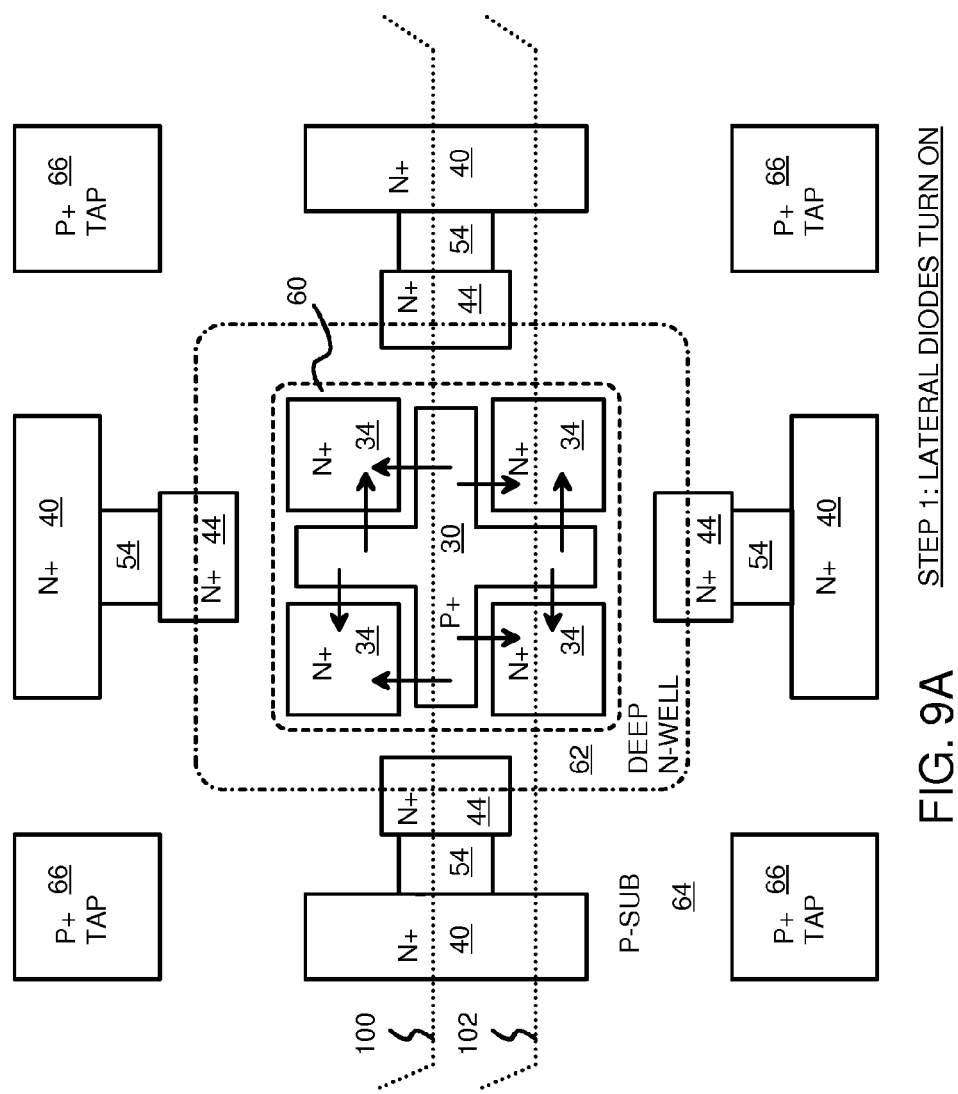

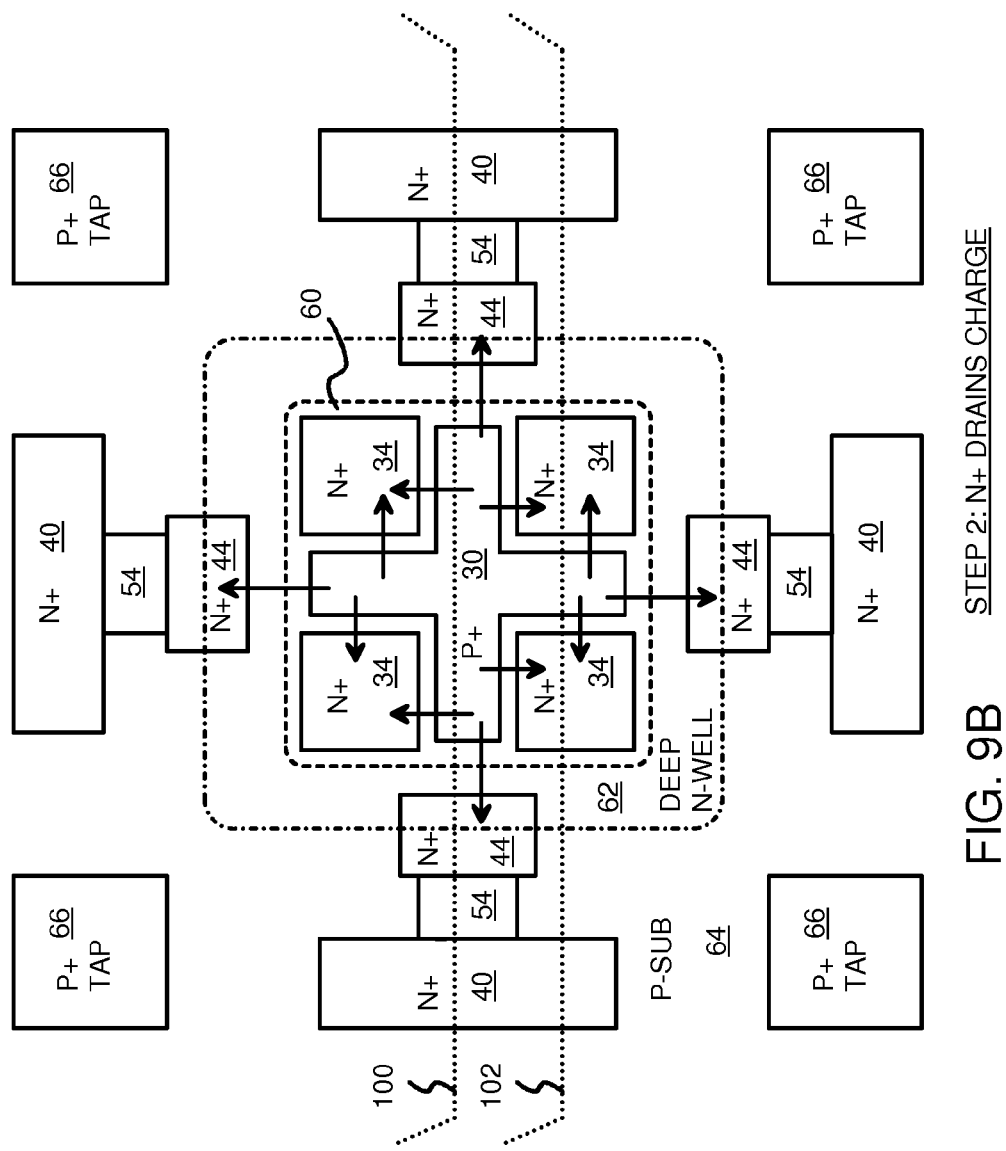
FIG. 9B   STEP 2: N+ DRAINS CHARGE

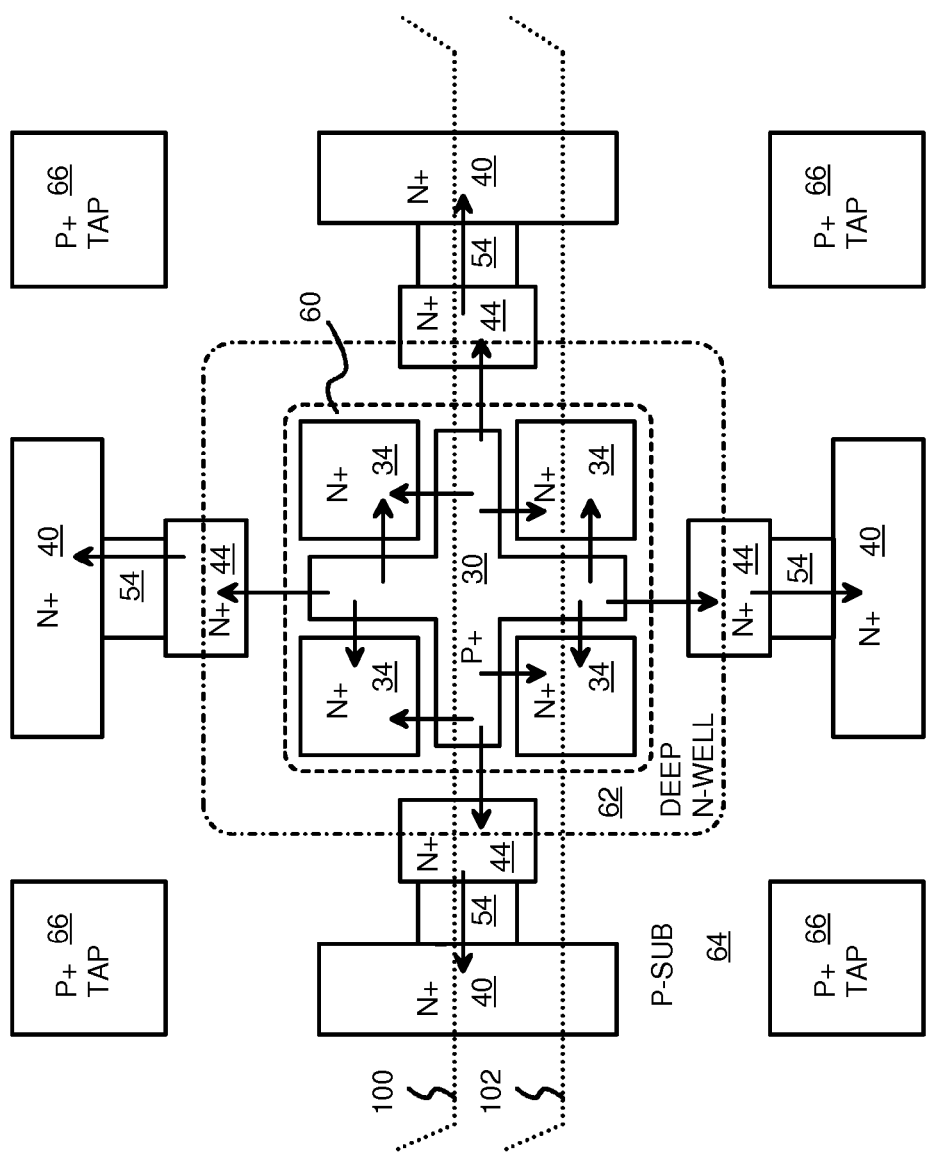
FIG. 9C   STEP 3: MOS PARASITIC NPN TURNS ON

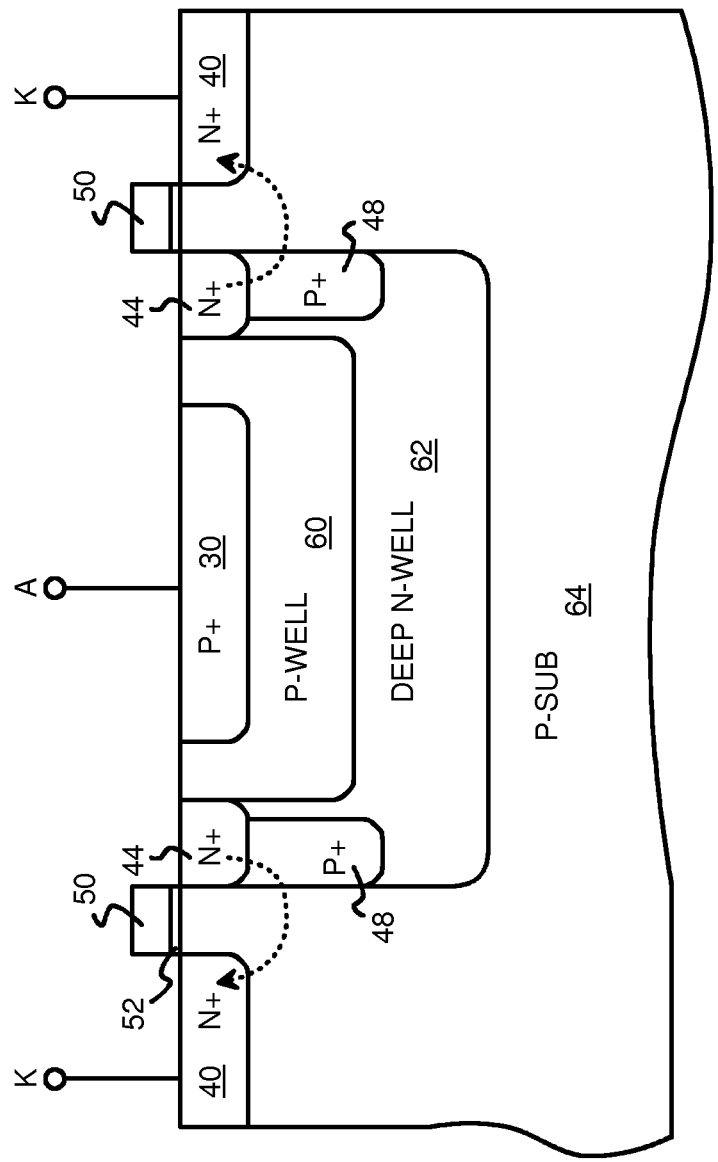
FIG. 9D   CROSS-SECTION 100
STEP 3: MOS PARASITIC NPN TURNS ON

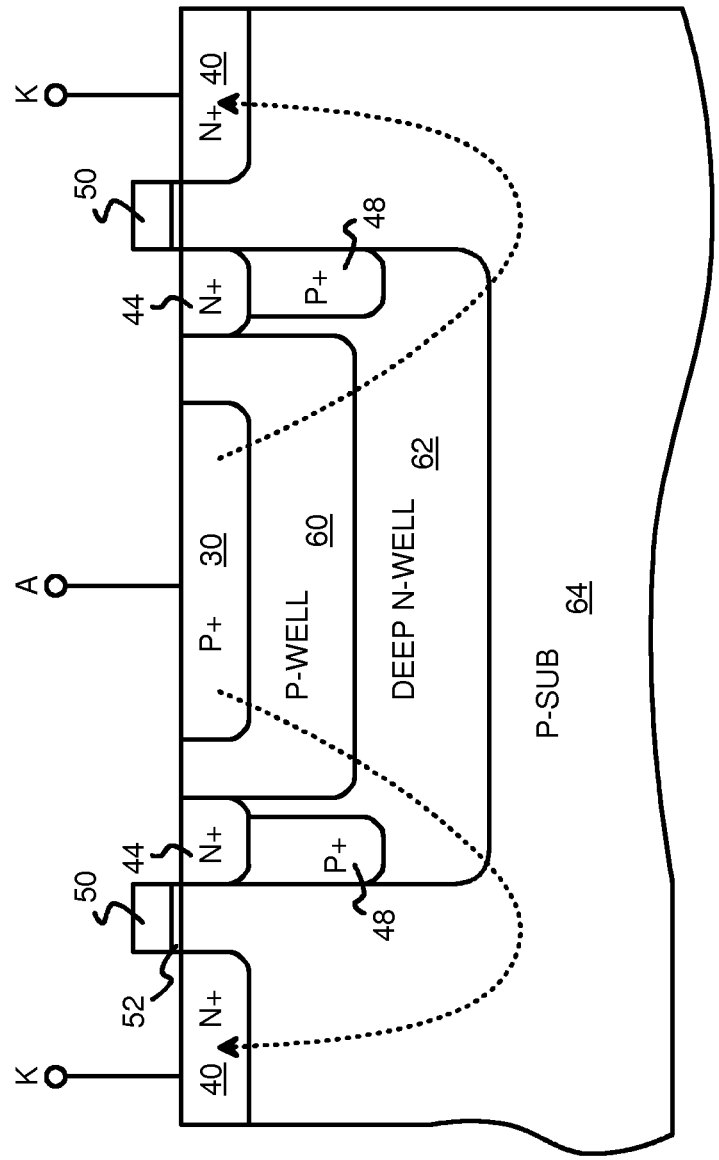
FIG. 9E  CROSS-SECTION 100
STEP 4: VERTICAL SCR TURNS ON

FIG. 12  CROSS-SECTION 100

FIG. 13    CROSS-SECTION 104

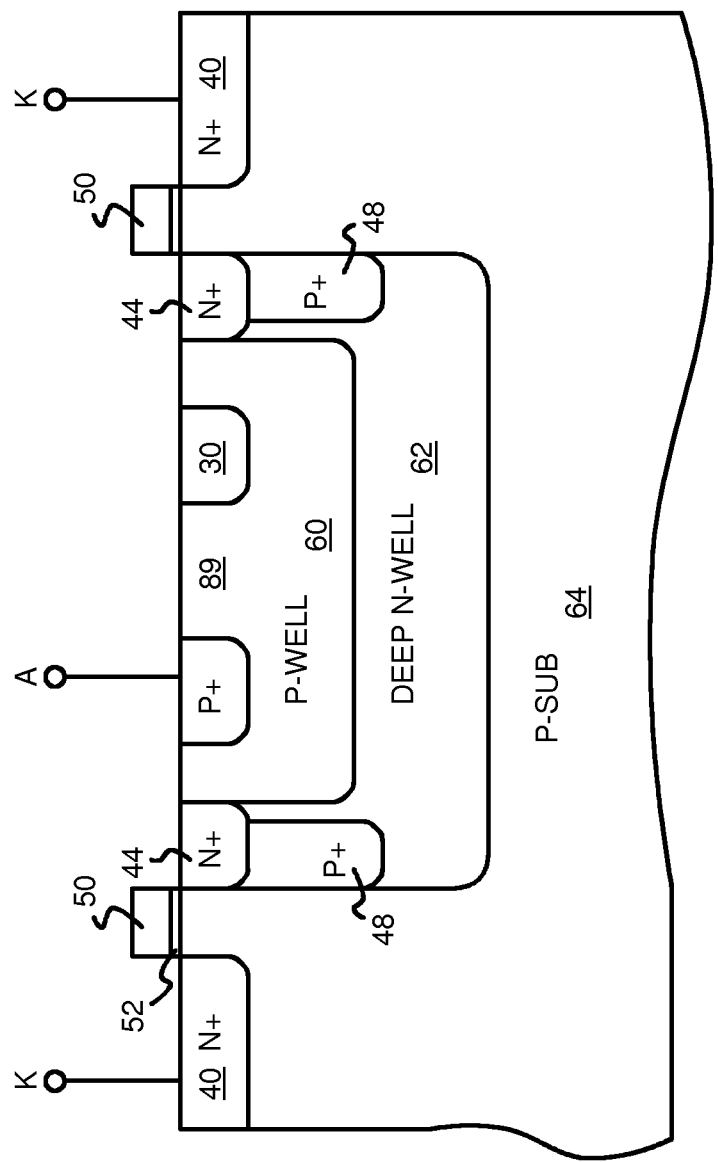
FIG. 15    CROSS-SECTION 100

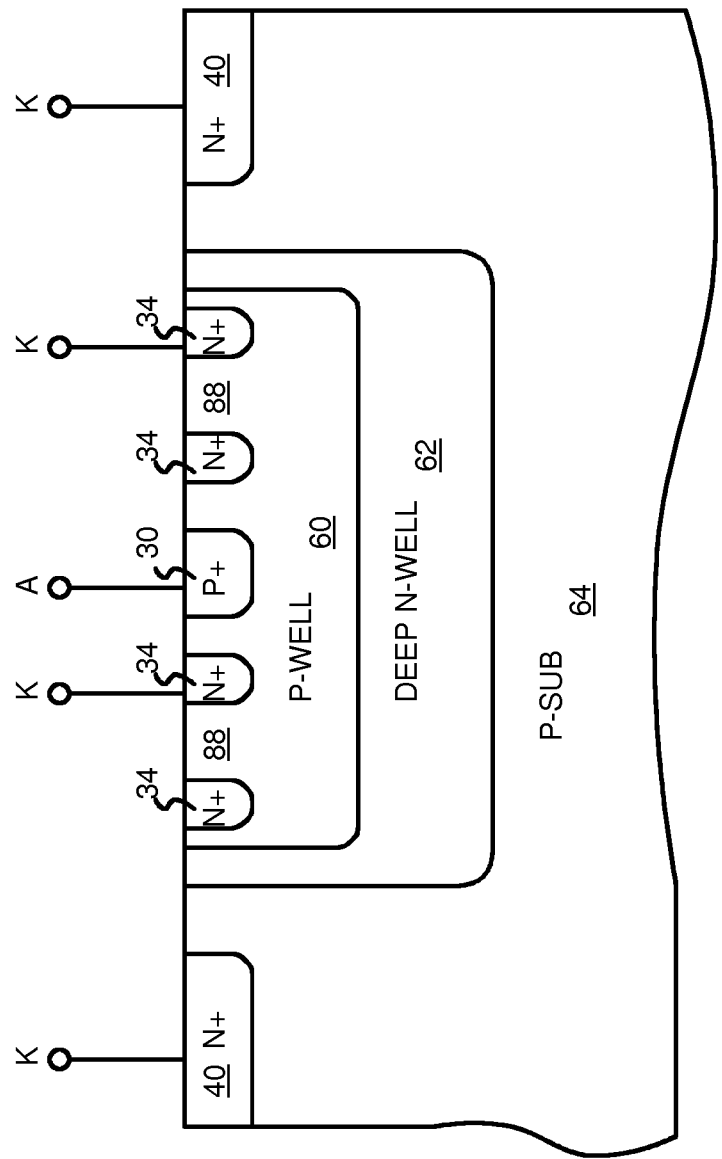
FIG. 16  CROSS-SECTION 102

LATERAL-DIODE, VERTICAL-SCR HYBRID STRUCTURE FOR HIGH-LEVEL ESD PROTECTION

FIELD OF THE INVENTION

This invention relates to electro-static-discharge (ESD) protection circuits, and more particularly to Silicon-Controlled Rectifier (SCR) structures that have ESD-protection diodes integrated within them.

BACKGROUND OF THE INVENTION

Integrated circuits (IC's) are prone to damage and failure from an electro-static-discharge (ESD) pulse. ESD failures may occur in the factory and contribute to lower yields. ESD failures may also occur in the field when an end-user touches a device. Smaller devices such as security chips in a smart credit-card or bank card are especially prone to ESD failure. As credit cards are replaced with smart cards using Integrated Circuit (IC) chips, many ESD failures will occur using the present ESD technology.

Various ESD-protection structures have been placed near input, output, or bi-directional I/O pins of ICs. Many of these protection structures use passive components such as series resistors, diodes, and thick-oxide transistors. Other ESD structures use an active transistor to safely shunt ESD current.

As manufacturing ability improves and device sizes shrink, lower voltages are applied to transistors during normal operation. These smaller transistors are much more susceptible to over-voltage failure but can operate with a lower power-supply voltage, thus consuming less power and producing less heat.

Such smaller transistors are often placed in an internal "core" of an IC, while larger transistors with gate lengths that are above the minimum are placed around the core in the periphery. ESD-protection structures are placed in the periphery using these larger transistors.

Thinner gate oxides of the core transistors can be shorted, and substrate junctions melted by relatively small capacitivly-coupled currents applied to the tiny core devices. Static charges from a person or machinery can produce such damaging currents that are only partially blocked by the input-protection circuits in the periphery.

FIG. 1 shows a chip with several ESD-protection clamps. Low-voltage core circuitry 20 contains core transistors 22, 24, which have a small channel length and can be damaged by currents at relatively low voltages. Low-voltage core circuitry 20 receives a power supply voltage VDD, such as 1.8 volts, 1.2 volts, or some other value. There may be thousands of core transistors in low-voltage core circuitry 20.

Protection from ESD pulses may be provided on each I/O pad, and by power clamp 26. Power clamp 26 is coupled between VDD and ground (VSS), and shunts current from an ESD pulse between the power rails.

Some cross-coupling may occur between different pads and low-voltage core circuitry 20, such as through substrates and capacitances. An ESD pulse applied to one I/O pad 10 may be coupled into low-voltage core circuitry 20 by this cross-coupling, causing damage to transistors 22, 24 in low-voltage core circuitry 20. Power clamp 26 may shunt enough current from the ESD pulse to reduce such cross-coupling to prevent damage. ESD pulses applied to I/O pins may still couple into low-voltage core circuitry 20, such as through power lines, but power clamp 26 may then be activated to reduce potential damage. Power clamp 26 may also turn on for other ESD pulses such as those applied to I/O pins, when the ESD pulse is shunted through a diode in the I/O pin's ESD-protection structure to the internal VDD rail, causing an indirect VDD-to-VSS ESD pulse. For example, an ESD pulse applied to I/O pad 10 may cause ESD protection device 12 to turn on to conduct to VDD.

Each I/O pad 10 may be outfitted with several ESD protection devices 12, 16 to protect against various possibilities. ESD protection device 16 turns on for a positive ESD pulse applied from ground to I/O pad 10, while ESD protection device 18 turns on for a positive ESD pulse applied from ground to I/O pad 10. Likewise, ESD protection device 12 turns on for a positive ESD pulse applied from I/O pad 10 to VDD while ESD protection device 14 turns on for a positive ESD pulse applied from I/O pad 11 to VDD. Power clamp 26 may also turn on in some situations.

Some prior-art ESD protection structures have large-area capacitors, resistors, or transistors which are undesirable. Some prior-art ESD-protection devices are not suited to standard CMOS processes, such as ESD-protection devices that use insulator layers in Silicon-On-Insulator (SOI) processes. Diodes have been uses as ESD-protection structures, but the diode's I-V characteristics allow for high voltages when large ESD currents flow, and these high voltages can still damage core transistors. Some ESD-protection structures use two diodes in series rather than one diode, but such stacked diodes are undesirable in some environments due to the increased voltage drop of two diodes in series. Silicon-Controlled Rectifiers (SCR's) have also been used successfully. Both an SCR and a diode may be used. However, simply having a diode and an SCR in an ESD-protection structure may produce erratic results that depend on the relative locations of the SCR and diode and other structures such as guard rings.

What is desired is an electro-static-discharge (ESD) protection circuit with both a diode and a SCR. An ESD protection device featuring parallel diode and vertical SCR paths to allow for better optimization is desirable. Tightly integrating a diode and an SCR is desired.

BRIEF DESCRIPTION OF THE DRAWINGS

FIG. 5 is a diagram of the ESD structure of FIGS. 2-4.

FIGS. 9A-E highlight operation of the hybrid vertical-SCR lateral-diode structure.

FIG. 15 is a cross section of the hybrid ESD structure of FIG. 14.

FIG. 16 is another cross section of the hybrid ESD structure of FIG. 14.

DETAILED DESCRIPTION

The present invention relates to an improvement in ESD protection circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors realize that an ESD-protection device having both an SCR and a diode can be constructed by tightly integrating the diode into the SCR structure. In particular, the inventors realize that the diode may be placed in the middle of the SCR layout. A lateral diode may be placed at the center of a square or ring-shaped vertical SCR structure. The center diode may turn on first and then trigger the SCR to turn on to shunt more current without raising the voltage. Thus the SCR keeps the voltage low, protecting the core transistors from damage that a higher voltage could cause.

The vertical SCR provides a lower ON resistance that the diode alone would provide. This lower ON resistance results in a lower voltage for a given ESD current. This lower ON resistance and lower voltage is especially beneficial for low-power devices such as smart card IC's.

Figure 2:
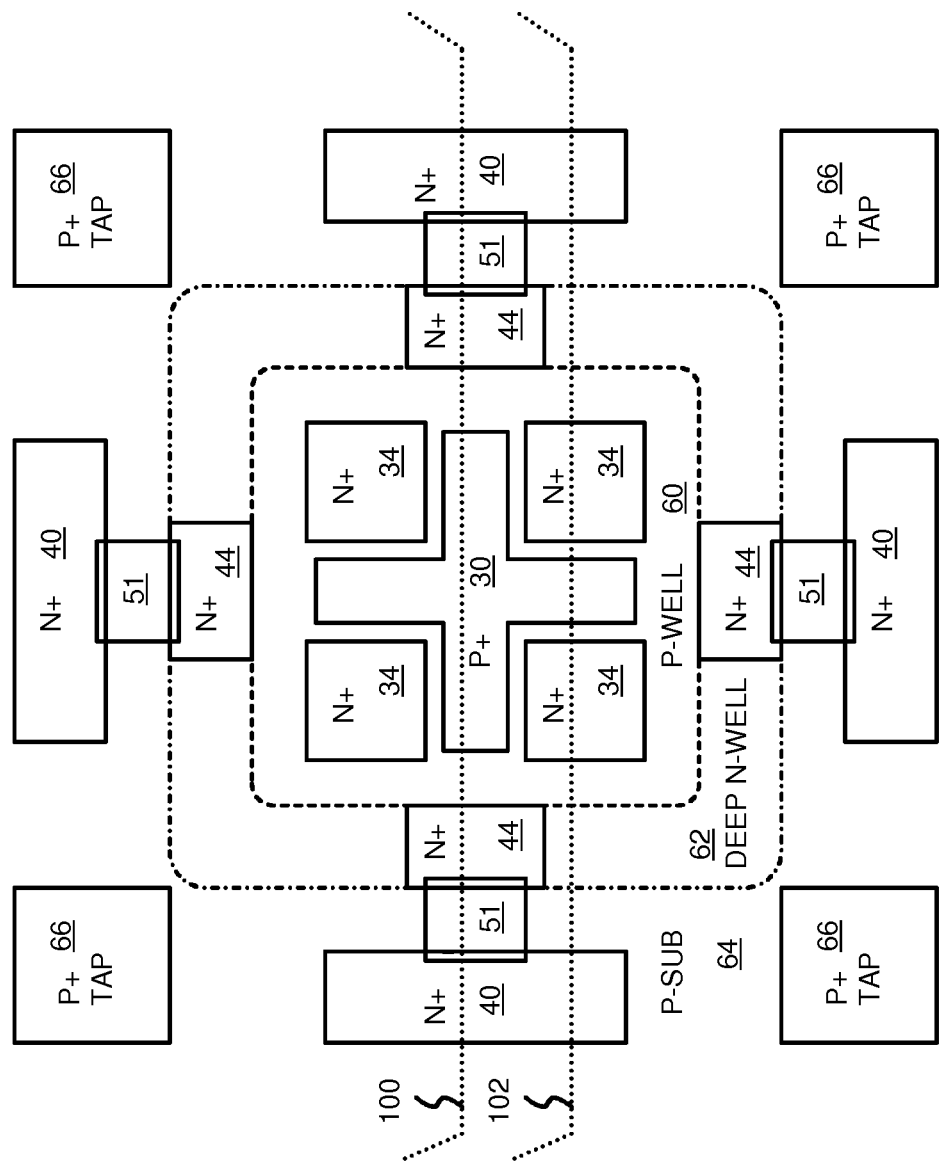
FIG. 2 is a layout of a hybrid structure with an integrated lateral diode inside a vertical SCR.

FIG. 2 is a layout of a hybrid structure with an integrated lateral diode inside a vertical SCR. A lateral pn diode is formed by P+ diode tap 30 to P-well 60 and N+ diode region 34. P+ diode tap 30 forms a cross-shaped region with four rectangles of N+ diode region 34 between the legs of P+ diode tap 30. This lateral pn diode is designed to turn on first at the start of an ESD event.

The lateral pn diode is surrounded by a SCR structure, with the lateral pn diode formed in the center of the SCR structure. The SCR is a generally vertical structure, starting with P+ diode tap 30 at the surface tapping P-well 60. Underneath P-well 60 is a deeper well structure, deep N-well 62, which is formed in P-substrate 64. Finally N+ regions 40 form the final terminal of the P-N-P-N structure of the SCR.

A triggering structure is added to turn on the vertical SCR. A lateral MOS transistor is formed by a gate oxide mask that opens up gate oxide regions 51. Thicker field oxides are formed outside of gate oxide regions 51 and outside of N+ and P+ regions. Gate oxide can be grown in the cutouts made by gate oxide regions 51, and a polysilicon or other gate formed over the gate oxide. N+ regions 40, 44 act as source/drain regions of the gate formed by gate oxide regions 51. Since N+ regions 40 are also the final terminal of the SCR structure, when the transistors of gate oxide regions 51 and N+ regions 40, 44 turn on, a trigger current is provided to turn on the SCR.

N+ regions 44 are nominally formed in deep N-well 62, but extend over the well boundary so that they have P-substrate 64 under them, or a deep P+ implant under them causes a P-substrate like region to be formed under N+ regions 44. Thus N+ regions 44 act as source/drain regions over P-substrate 64. The deep P+ implant can decrease the vertical SCR trigger voltage.

P+ taps 66 allow P-substrate 64 to be biased, such as to a ground. Cross-section 100 passes through P+ diode tap 30 of the lateral pn diode and through the triggering MOS transistors of N+ regions 40, 44, and gate oxide regions 51. Cross-section 102 does not pass through the triggering MOS transistor, but passes through N+ diode region 34 and P+ diode tap 30 of the lateral pn diode, and through N+ regions 40 of the SCR.

Figure 3:
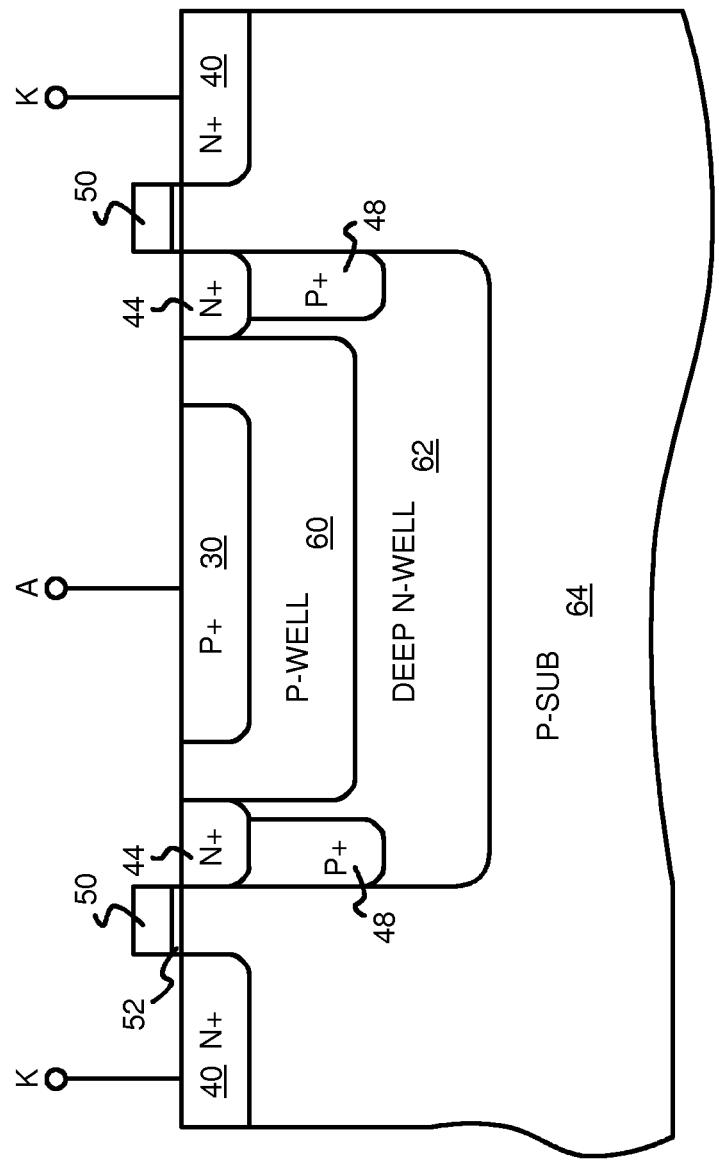
FIG. 3 is a cross-section of a hybrid ESD protection device showing the vertical SCR and a MOS triggering transistor.

FIG. 3 is a cross-section of a hybrid ESD protection device showing the vertical SCR and a MOS triggering transistor. Cross-section 100 passes through P+ diode tap 30 of the lateral pn diode and through the triggering MOS transistors of N+ regions 40, 44, and gate oxide regions 51. The deep P+ implant can decrease the vertical SCR trigger voltage.

Deep N-well 62 is formed in P-substrate 64 before P-well 60 is formed in deep N-well 62. There may also be shallow N-wells (not shown) with approximately the same depth as P-well 60 that could be used for core p-channel transistors.

P+ diode tap 30 is formed at the surface within P-well 60 and is connected to the anode A of the SCR and of the lateral diode. N+ regions 40 formed in P-substrate 64 are connected to the cathode K of the SCR.

The vertical SCR is a P-N-P-N structure from Anode A to P+ diode tap 30, down to P-well 60, downward to deep N-well 62, and then down to P-substrate 64, before rising back to the surface at N+ regions 40 to connect to the cathode K.

A deep implant is available in some advanced semiconductor processes. A lower effective doping or doping density may be used for the deep implant than for the N+, P+ source/drain/tap implants. However, the implant energy is greater for the deep implant so that deep P+ implant region 48 is formed deeper in the substrate, under N+ regions 44. The surface of the substrate above P+ implant region 48 may be n-type at N+ regions 44. P+ implant region 48 may be defined by a separate mask at layout, not shown in FIG. 2. The shape and location of deep P+ implant region 48 does not have to exactly match that of N+ regions 44.

Alternately, a faster-diffusing dopant may be used for deep P+ implant region 48 than for N+ region 44 to generate the desired doping profile with deep P+ implant region 48 under N+ region 44.

A triggering MOS transistor is formed between N+ regions 40, 44. Gate oxide 52 is formed in gate oxide regions 51 defined by the mask of FIG. 2. Gate 50 formed over gate oxide 52 may be a polysilicon gate. Gate 50 may be floating, grounded, or connected to cathode K. Gate 50 may be grounded during normal chip operation, but floating during some ESD tests, such as pin-to-pin ESD tests that only connect to two I/O pins at a time.

Figure 4:
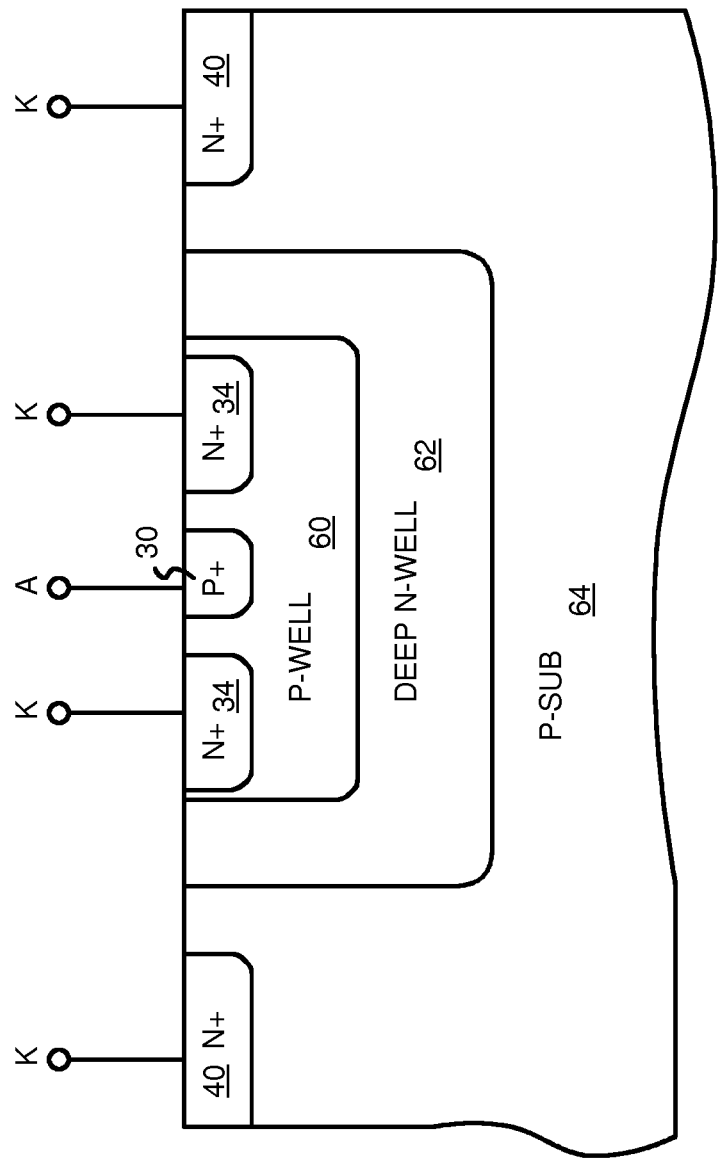
FIG. 4 is a cross-section of the hybrid ESD protection device showing the lateral diode inside the vertical SCR.

FIG. 4 is a cross-section of the hybrid ESD protection device showing the lateral diode inside the vertical SCR. Cross-section 102 does not pass through the triggering MOS transistor, but passes through N+ diode region 34 and P+ diode tap 30 of the lateral pn diode, and through N+ regions 40 of the SCR.

Deep N-well 62 is formed in P-substrate 64 before P-well 60 is formed in deep N-well 62. The vertical SCR is a P-N-P-N structure from Anode A to P+ diode tap 30, down to P-well 60, downward to deep N-well 62, and then down to P-substrate 64, before rising back to the surface at N+ regions 40 to connect to the cathode K.

The lateral pn diode is formed in the middle of the SCR structure. The lateral diode is electrically connected in parallel with the SCR, between anode A and cathode K.

P+ diode tap 30 is formed at the surface within P-well 60 and is connected to the anode A of the SCR and of the lateral diode. Nearby and within P-well 60 are formed N+ diode regions 34. N+ diode regions 34 are connected to cathode K of the lateral diode.

While the vertical SCR and the lateral diode share the same anode A, they have different N+ regions connected to the cathode K terminal. N+ diode regions 34 are connected to cathode K of the lateral diode, while N+ regions 40 formed in P-substrate 64 are connected to the cathode K of the SCR.

FIG. 5 is a diagram of the ESD structure of FIGS. 2-4. An ESD pulse is applied across nodes A, K. Anode A connects to P+ diode tap 30 which biases P-well 60 while cathode K connects to N+ diode region 34 of lateral pn diode 80. Although lateral pn diode 80 turns on first, it requires an undesirably high voltage to carry the high ESD current. Thus SCR 90 is formed in parallel with lateral pn diode 80 to shunt current and lower the ON resistance and voltage when the high ESD current is shunted.

Vertical SCR 90 is a P-N-P-N structure from Anode A to P+ diode tap 30, down to P-well 60, downward to deep N-well 62, and then down to P-substrate 64, before rising back to the chip surface at N+ regions 40 to connect to the cathode K.

Vertical SCR 90 is a large structure that can conduct a large current from Anode A to cathode K. However, it is difficult to turn on an SCR. Triggering MOS transistor 54 is added between N+ regions 40, 44. When triggering MOS transistor 54 turns on, current bypasses P-substrate 64, which has a high resistance due to the low doping and large area of P-substrate 64. This initial current through triggering MOS transistor 54 turns on the p-n emitter junction of P+ diode tap 30, P-well 60 to deep N-well 62, flooding deep N-well 62 and eventually P-substrate 64 with carriers to permit conduction of the vertical SCR.

Figure 6:
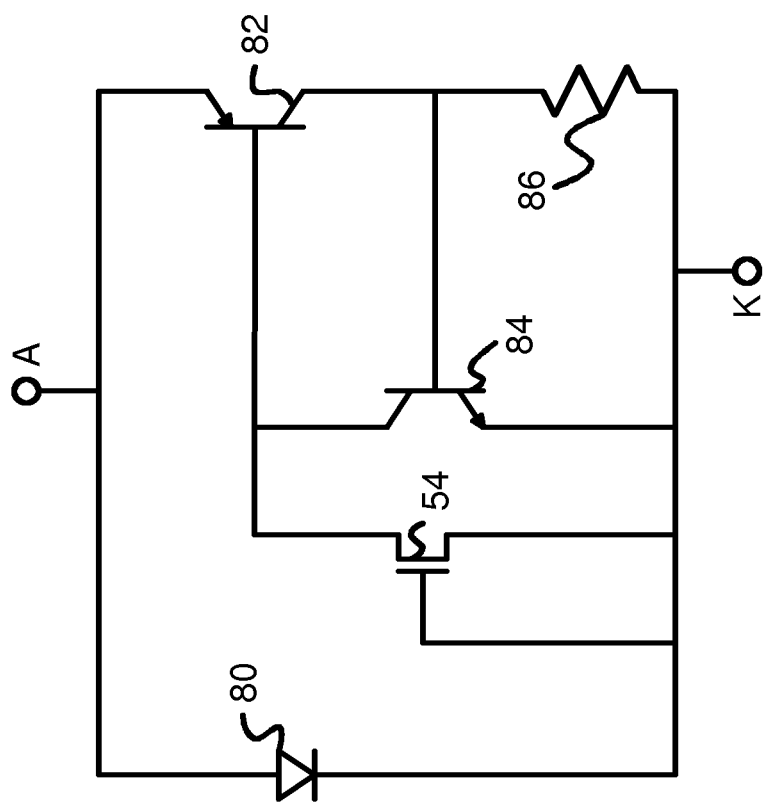
FIG. 6 is a schematic diagram of the hybrid ESD-protection structure.

FIG. 6 is a schematic diagram of the hybrid ESD-protection structure. Lateral pn diode 80 is connected between anode A and cathode K. Lateral pn diode 80 turns on before the vertical SCR.

The vertical SCR is a P-N-P-N structure that can be modeled as PNP transistor 82 and NPN transistor 84. The base of PNP transistor 82 is also the collector of NPN transistor 84. The collector of PNP transistor 82 is also the base of NPN transistor 84. Resistor 86 is primarily the resistance of P-substrate 64.

PNP transistor 82 has Anode A, P+ diode tap 30, and P-well 60 as its emitter, deep N-well 62 as its base, and P-substrate 64 as its collector. Resistor 86 is the resistance of P-substrate 64 before N+ regions 40 to connect to the cathode K. In one theoretical interpretation, once enough current flows through resistor 86 to produce a voltage drop of about 0.5 volt, the base-emitter junction in NPN transistor 84 turns on, pulling more current from its collector which is also the base of PNP transistor 82. As more current is pulled from the base of PNP transistor 82 by the collector of NPN transistor 84, PNP transistor 82 increases conduction rapidly, which rapidly increases the SCR current.

NPN transistor 84 has deep N-well 62 as its collector, P-substrate 64 as its base, and N+ regions 40 as its emitter. NPN transistor 84 is bypassed by triggering MOS transistor 54, which turns on more easily than doe NPN transistor 84. The gate of triggering MOS transistor 54 may be grounded, either a hard ground or a virtual ground, or may be floating or connected to cathode K as shown. Triggering MOS transistor 54 still operates when its gate is floating, although it may not operate as efficiently.

Figure 7:
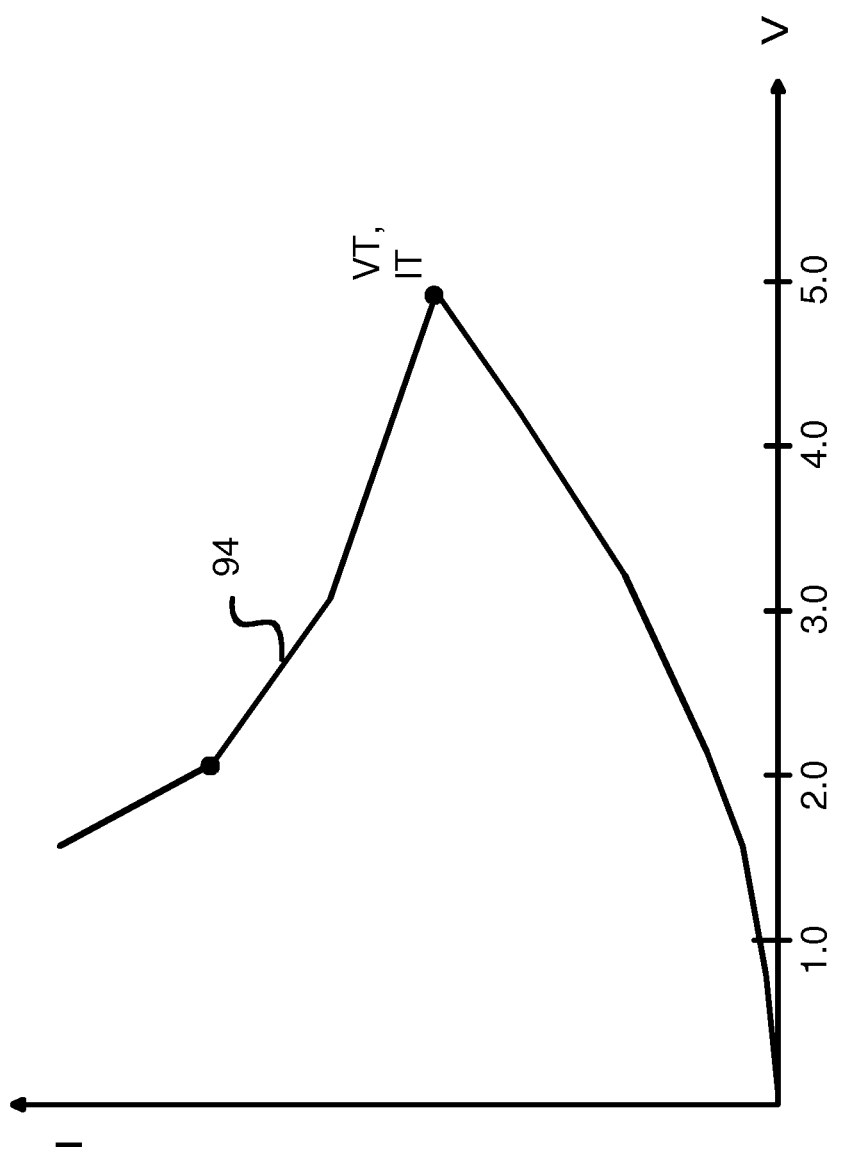
FIG. 7 is an I-V graph for the hybrid ESD-protection structure with parallel vertical SCR and lateral diode paths.

FIG. 7 is an I-V graph for the hybrid ESD-protection structure with parallel SCR and diode paths. I-V curve 94 is the sum of the diode current and the SCR current.

Initially, at the start of an ESD event, the SCR is off. I-V curve 94 shows that the voltage rises from zero as lateral pn diode 80 turns on and conducts current until trigger voltage VT. Above about 4.5 volts, triggering MOS transistor 54 turns on and triggers the vertical SCR at trigger voltage VT. Then the vertical PNPN structure turns on and a larger current than trigger current IT flows from node A to node K. Just after trigger voltage VT, as the current increases, the vertical SCR shunts the most current, and the current shunted by the lateral diode decreases. An avalanche current mechanism decreases the voltage, causing the snap-back of I-V curve 94. Thus I-V curve 94 shows a snap back at trigger voltage VT, rather than a continuation of the diode curve. The voltage drops after trigger voltage VT as more current is carried by the SCR. Actual device curves may vary and show secondary effects not shown in simplified I-V curve 94.

Figure 8:
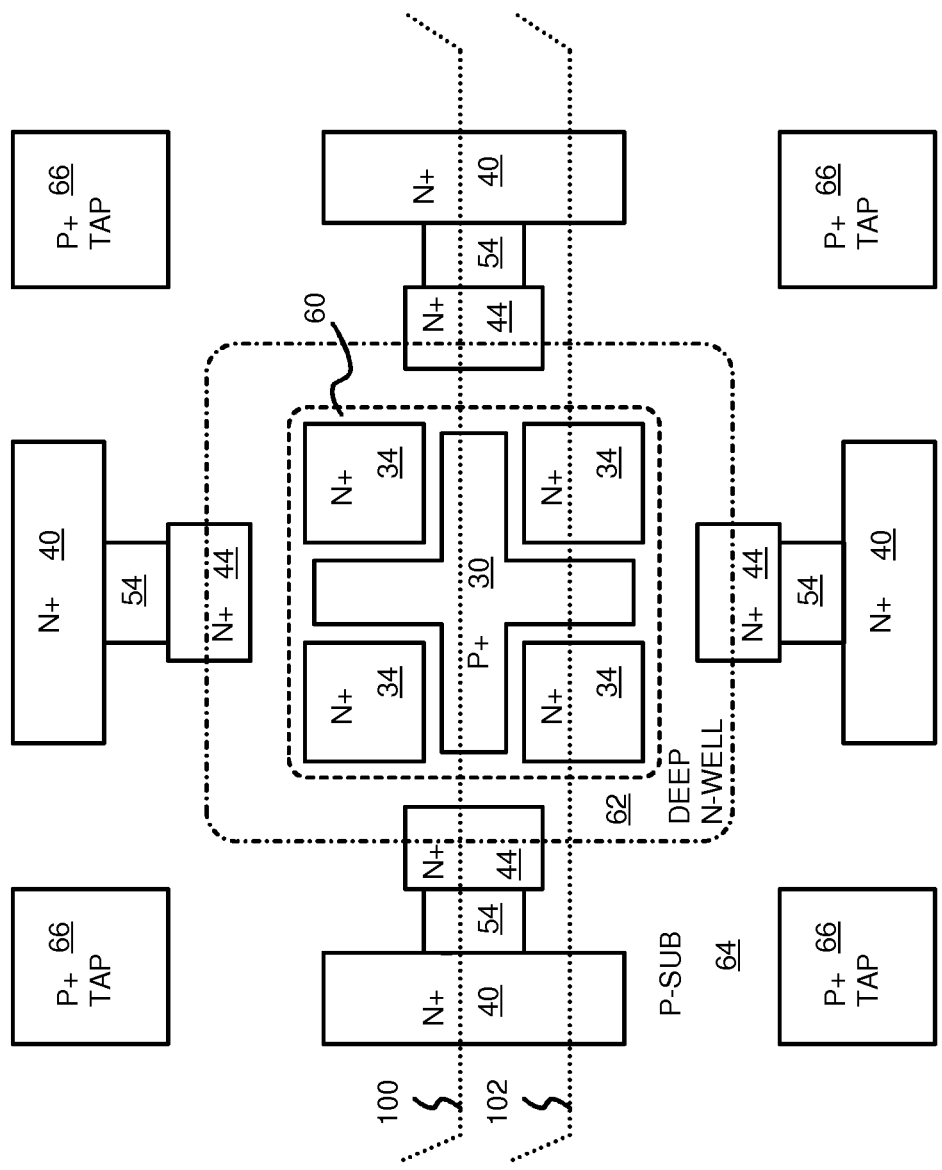
FIG. 8 is an overhead view of the hybrid structure with a lateral diode inside a vertical-SCR.

FIG. 8 is an overhead view of the hybrid structure with a lateral diode inside a vertical-SCR. The exact locations of surface and sub-surface regions may vary from the mask images. Diffusion and oxide growth can cause region boundaries to shift, especially for deeper regions such as deep N-well 62.

Triggering MOS transistor 54 is formed between N+ regions 40, 44. The exact boundary of deep N-well 62 to P-substrate 64 may vary. The boundary may be under N+ regions 44, so that some of N+ regions 44 are over deep N-well 62 and some of N+ regions 44 are over P-substrate 64, as shown in FIG. 8.

FIGS. 9A-E highlight operation of the hybrid vertical-SCR lateral-diode structure. In FIG. 9A, at the start of an ESD event applied between terminals A and K, the lateral pn diode turns on as the voltage rises to about half a volt. Current flows across the p-Well to N+ junction, from P+ diode tap 30 into P-well 60 and to N+ diode regions 34 that surround P+ diode tap 30. The cross shape of P+ diode tap 30 increases the pn junction perimeter that the current flows across, reducing the needed current density and reducing heating and possibility of thermal damage. Other layouts could be used, such as many inter-mingled fingers of P+ diode tap 30 and N+ diode region 34. However, the lateral diode is contained within P-well 60, which is in the middle of the SCR structure.

In FIG. 9B, as the current across the lateral pn diode from P+ diode tap 30 to N+ diode region 34 increases, some carriers cross the pn junction from P-well 60 to deep N-well 62, rather than from P-well 60 to N+ diode region 34. These carriers charge deep N-well 62 and also charge N+ regions 44 within deep N-well 62. Since N+ regions 44 are located near the ends of P+ diode tap 30 without any intervening N+ diode region 34, carriers are more likely to cross to N+ regions 44 than to other parts of deep N-well 62. Thus the cross-like layout of P+ diode tap 30 and location of N+ regions 44 enhances this effect, causing N+ regions 44 to charge more rapidly than in other layouts.

In FIG. 9C, N+ regions 44 that were charged are also the drains of triggering MOS transistors 54. If the gates of triggering MOS transistor 54 rise in voltage, such as due to capacitive coupling of the rise in voltage of N+ regions 44, then a parasitic NPN transistor turns on under triggering MOS transistor 54, allowing current to flow from charged N+ regions 44 to N+ regions 40. If the gate of triggering MOS transistor 54 remains at the lower source voltage, current may still flow when the parasitic NPN transistor turns on. Since N+ regions 40 are connected to cathode K, current can be removed from N+ regions 40. Thus more current flows through this path from N+ regions 44 to N+ regions 40 as this is the easiest path for current to take.

FIG. 9D shows cross-section 100 when the parasitic NPN transistors of triggering MOS transistors 54 turn on as was shown in the overhead view of FIG. 9C. Current conducts in the parasitic NPN transistor under triggering MOS transistor 54 from N+ regions 44 to N+ regions 40. Deep P+ implant region 48 causes the regions under N+ regions 44 to act as an extension of P-substrate 64. Thus at least a portion of N+ regions 44 act as transistor source/drain regions for triggering the parasitic NPN transistors of MOS transistor 54, or as a N+ emitter region in the parasitic NPN transistor. A conducting channel may form under gate oxide 52 of triggering MOS transistor 54 when the voltage of gate 50 is higher than the source voltage of N+ regions 40, or conduction may occur under triggering MOS transistor 54 by avalanche breakdown, punch-through, or other mechanisms, such as when the parasitic NPN turns on. The deep P+ implant can decrease the parasitic NPN turn on voltage In FIG. 9E, the parasitic NPN transistor for triggering MOS transistor 54 has already turned on. This positive current flow under triggering MOS transistor 54 near the chip surface allows N+ regions 40 to begin emitting electrons into P-substrate 64. These electrons flow across P-substrate 64, which is the base of NPN transistor 84, until being collected by deep N-well 62, which acts as the collector. However, deep N-well 62 is also the base of PNP transistor 82, and this additional base current turns on PNP transistor 82 more strongly, causing more positive current to flow from emitter P-well 60, through base deep N-well 62, and into collector P-substrate 64. Thus the SCR action is initiated and a very large SCR current may be shunted between anode A and cathode K, P+ diode tap 30 to N+ regions 40. This current flows vertically downward from P+ diode tap 30 to P-well 60, then to deep N-well 62 and to P-substrate 64. Then the current through P-substrate 64 spreads laterally and is collected by N+ regions 40 and into cathode K. As the anode-to-cathode voltage drops as vertical SCR 90 turns on, less current flows through lateral pn diode 80 (FIGS. 5-6).

Since the SCR has a large junction area for P-substrate 64 to deep N-well 62, a large current may flow while still having a relatively low current density, preventing thermal damage. The junction area for lateral pn diode 80 is much smaller since it is contained within P-well 60, which is smaller and inside of deep N-well 62. Also, any substrate current that leaks out of lateral pn diode 80 is eventually collected by deep N-well 62 that surrounds lateral pn diode 80.

Figure 10:
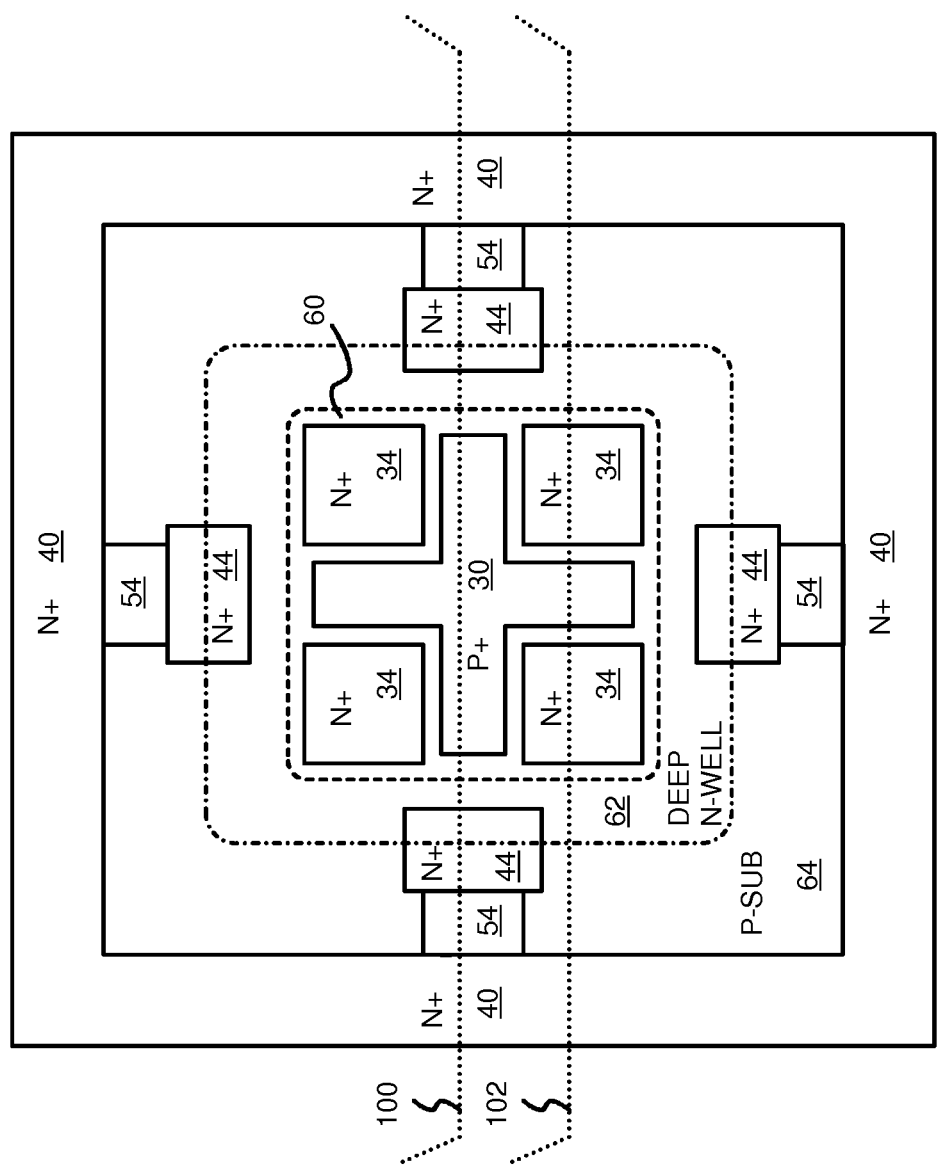
FIG. 10 is a diagram of an alternative of the ESD structure.

FIG. 10 is a diagram of an alternative of the ESD structure. P+ taps 66 that connect P-substrate 64 to ground during normal chip operation may be removed, or placed farther away from deep N-well 62. Instead, N+ regions 40 are extended to form a ring structure that completely surrounds deep N-well 62. More of the current from deep N-well 62 can be collected by the larger N+ regions 40, so the current of the vertical SCR is increased.

Another alternative is to lengthen N+ regions 40 and reduce the size of P+ taps 66. This alternative still increases SCR current, but to a lesser degree.

Figure 11:
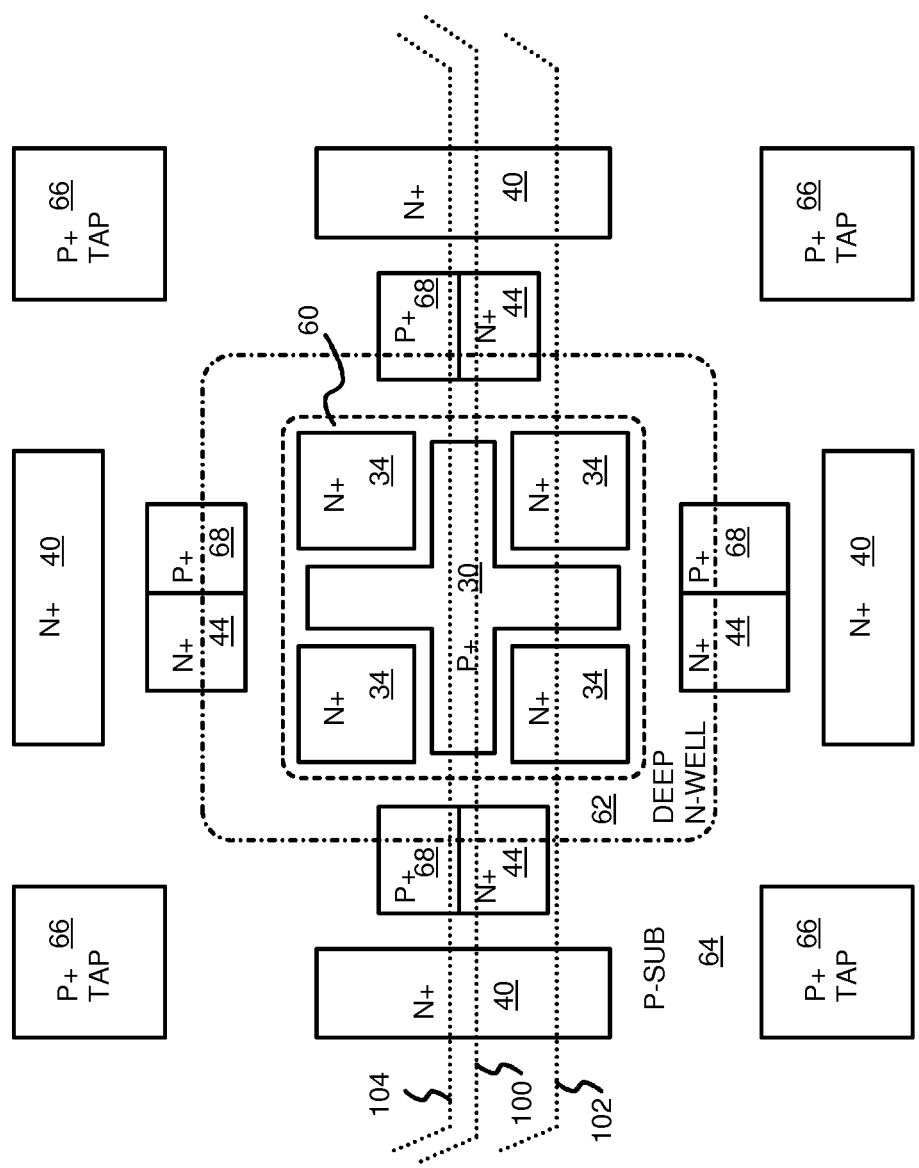
FIG. 11 is another alternative of the hybrid ESD structure without triggering transistors.

FIG. 11 is another alternative of the hybrid ESD structure without triggering transistors. P+ region 68 is added next to N+ region 44, for each of the four N+ regions 44. Each of the four N+ regions 44 is reduced in size. There is no deep P+ implant region 48 since there is no triggering MOS transistor 54. Triggering MOS transistor 54 may be deleted as shown, or may still be present (not shown). When triggering MOS transistor 54 is deleted, a field-oxide transistor may still be present, or avalanche or punch-through conduction may still occur between N+ regions 40 and N+ regions 44 or P+ region 68. N+ regions 44 and P+ region 68 together may trigger the vertical SCR.

Figure 12:
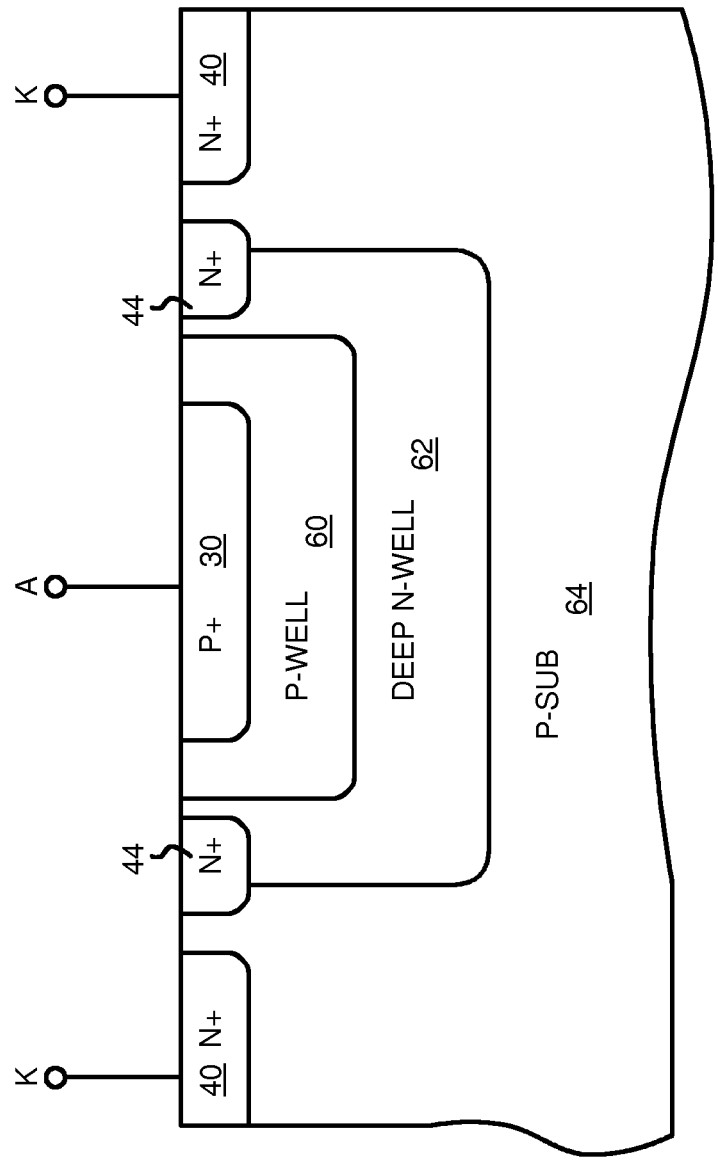
FIG. 12 is a cross section of the hybrid ESD structure of FIG. 11 without triggering transistors.

FIG. 12 is a cross section of the hybrid ESD structure without triggering transistors. Cross-section 100 passes through P+ diode tap 30 of the lateral pn diode and through N+ regions 40, 44. Since there is no deep P+ implant region 48, SCR current may flow in more of a lateral direction under N+ regions 44, across P-well 60, deep N-well 62, and P-substrate 64 to N+ regions 40. Thus the substrate resistance may be reduced by this embodiment.

Figure 13:
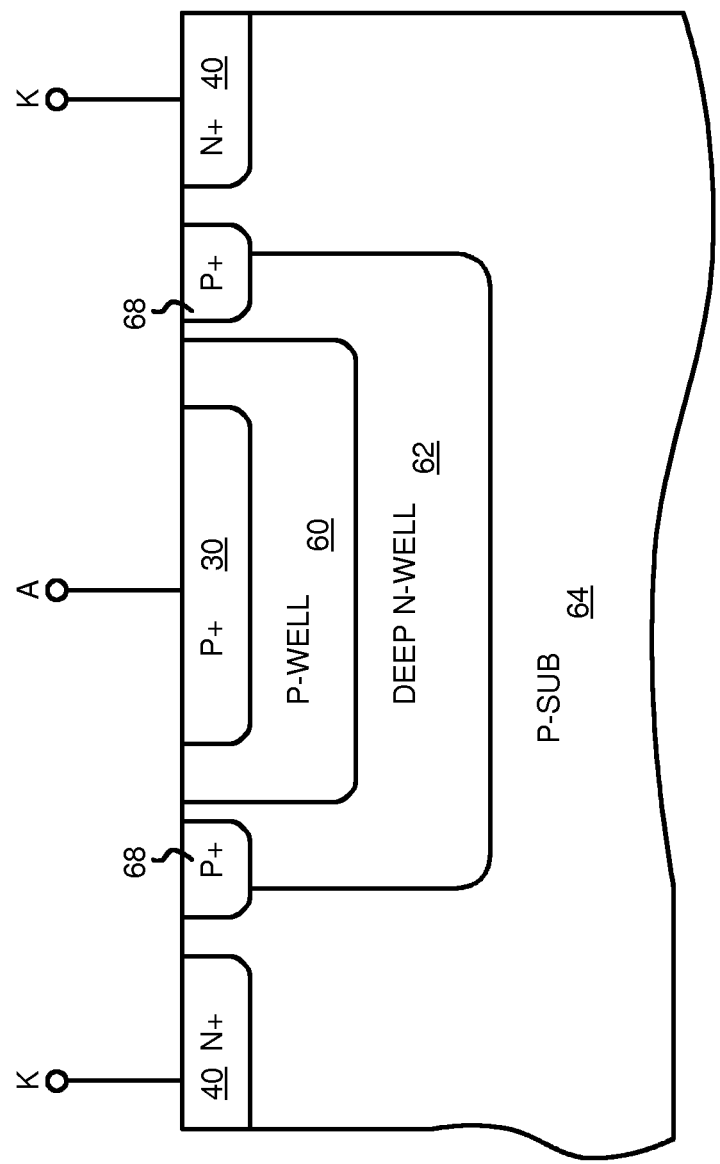
FIG. 13 is another cross section of the hybrid ESD structure of FIG. 11 without triggering transistors.

FIG. 13 is another cross section of the hybrid ESD structure without triggering transistors. Cross-section 104 passes through P+ diode tap 30 of the lateral pn diode and through N+ regions 40, and P+ regions 68. Since there is no deep P+ implant region 48, SCR current may flow in more of a lateral direction under P+ region 68, across P-well 60, deep N-well 62, and P-substrate 64 to N+ regions 40. Thus the substrate resistance may be reduced by this embodiment.

Since there are both N+ regions 44 (FIG. 12) and P+ region 68 (FIG. 13) adjacent to each other at the well boundary, the exactly location of the well boundary is less important. This embodiment may be less sensitive to process variations that cause the well boundary to shift. The well boundary between deep N-well 62 and P-substrate 64 may be less predictable that other process steps due to the depth of deep N-well 62. When triggering MOS transistors 54 are present for this embodiment, the location of gate oxide regions 51 may overlap edges of both N+ regions 44 and P+ region 68.

Figure 14:
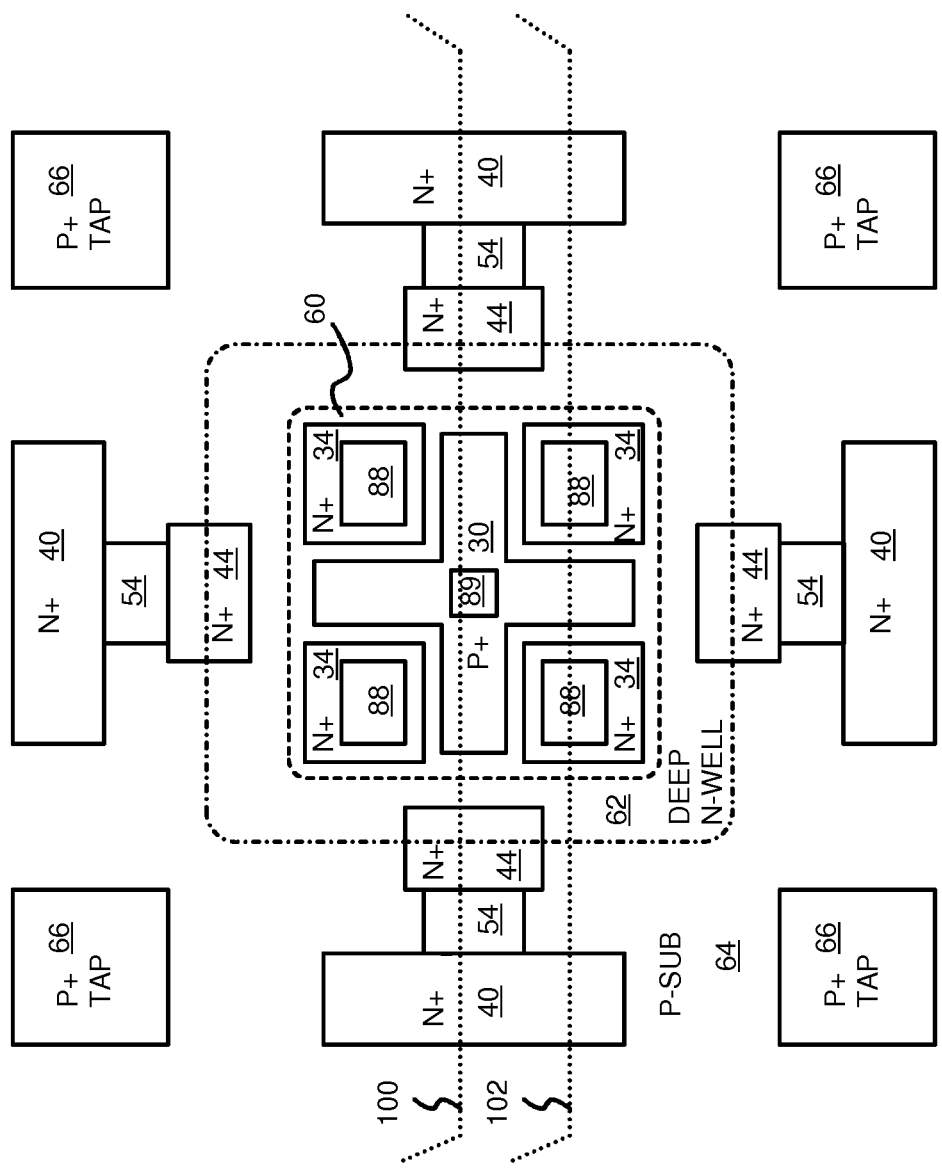
FIG. 14 shows a hybrid lateral-diode vertical-SCR ESD-protection structure with a hollowed cathode.

FIG. 14 shows a hybrid lateral-diode vertical-SCR ESD-protection structure with a hollowed cathode. Rather than being solid rectangles, N+ diode region 34 now have cutouts 88 formed within them. Cutouts 88 are parts of the underlying P-well 60 that reach the chip surface. N+ diode region 34 forms a ring with cutout 88 in the middle of the ring of N+ diode region 34.

Since the area of N+ diode region 34 is reduced by cutout 88, the capacitance is also reduced. Thus the cathode K, that connects to N+ diode region 34, has a lower capacitance. This lower cathode capacitance may be desirable for some applications.

Likewise, cutout 89 within P+ diode tap 30 reduces the capacitance of P+diode tap 30. The effective P-well to Deep N-well junction area is reduced, so the vertical SCR capacitance may be reduced.

FIG. 15 is a cross section of the hybrid ESD structure of FIG. 14. Cross-section 100 passes through P+ diode tap 30 of the lateral pn diode and through the triggering MOS transistors of N+ regions 40, 44, and gate oxide 52 and gate 50. Cutout 89 is a portion of P-well 60 that reaches the chip surface, reducing the size of P+ diode tap 30.

FIG. 16 is another cross section of the hybrid ESD structure of FIG. 14. Cross-section 102 does not pass through the triggering MOS transistor, but passes through N+ diode region 34 and P+ diode tap 30 of the lateral pn diode, and through N+ regions 40 of the SCR. Cutouts 88 reduce the size of N+ diode region 34, thus reducing its capacitance. Since the diode current flows from P+ diode tap 30 to N+ diode region 34, the cutout region is not needed for lateral pn diode 80.

The shape of N+ diode region 34 could also be changed to an L− shape, with only two of the four sides present, the two sides nearest P+ diode tap 30. The other two sides near the boundary of P-well 60 are not needed.

Alternate Embodiments

Several other embodiments are contemplated by the inventors. The alternatives of FIGS. 2 and 10-16 may be combined in various ways, or used separately or in other combinations. While complementary metal-oxide-semiconductor (CMOS) transistors have been described, other kinds of transistors could be used, such as n-channel only, p-channel only, or various alternate transistor technologies such as Bipolar or BiCMOS.

While descriptions of current flows and operations have been presented, these are theoretical and the theories may be incomplete or even incorrect. Regardless of the physical mechanisms and theoretical interpretations, the structure does offer protection from ESD pulses. Especially for small devices, currents may flow in unusual ways and using mechanisms that have not yet been thoroughly researched and understood.

Cutouts 88 in N+ diode region 34 may be used without cutout 89 in P+ diode tap 30. Other shapes and physical layouts may be substituted, such as intermingled fingers.

Diodes may be implemented as n-channel, p-channel, or bipolar transistors, or junctions within these transistors. A capacitor could be attached to a resistance to provide an R-C time delay, or more complex circuits such as active triggering circuits may be added. In some embodiments, high-voltage transistors may be used rather than low-voltage transistors with appropriate bias conditions. The gate lengths can be increased to provide better protection from damage.

Different transistor, capacitor, resistor, and other device sizes can be used, and various layout arrangements can be used, such as multi-leg, ring, doughnut or irregular-shape transistors. Additional taps, guard rings, transistors, and other components may be added. The power node could be a common-discharge line (CDL) that normally floats rather than a power line. While a simple inverter of core transistors 22, 24 has been shown, more complex gates and interconnections may drive internal nodes, and there can be several internal nodes that connect to different input or output pads. The input/output pads may be connected to an input buffer, test-scan logic, and other circuits. More than one power supply may be used.

P and N wells could be reversed, and a NPNP vertical SCR used rather than a PNPN vertical SCR. A deep P-well could be used rather than or in addition to deep N-well 62. Some embodiments may not use deep P+ implant region 48, or the location and depth of deep P+ implant region 48 may be shifted. The final profiles and shapes of various layers such as deep N-well 62, deep P+ implant region 48, P-well 60, N+ regions 44, 40, and triggering MOS transistor 54 may differ depending on the process used. In particular, deeper layers may shift around relative to the mask layouts.

Triggering MOS transistor 54 may be implemented as a p-channel transistor rather than an n-channel transistor, and the vertical PNPN device of P+ diode tap 30, P-well 60, deep N-well 62, P-substrate 64, and N+ regions 40 may be replaced with a vertical PNPN device, with reversed dopants. The shape of the vertical PNPN device may differ, such as by having a more rounded bottom or filed-oxide boundaries.

Additional leaker devices such as resistors and small transistors could be added. Parasitic capacitances and resistances may be used from some components, depending on the process and device sizes used.

The ESD-protection circuit can be combined with other input-protection circuits, such as a power clamp circuit, other pad protection circuits, or a series-resistor protection circuit to the gate of an input buffer. Grounded-gate and thick oxide protection transistors and diodes can also be added at various points to increase ESD protection. One, two, of four of the lateral-diode vertical-SCR structures could be added to each I/O pin, or just to input pins.

Figure 1:
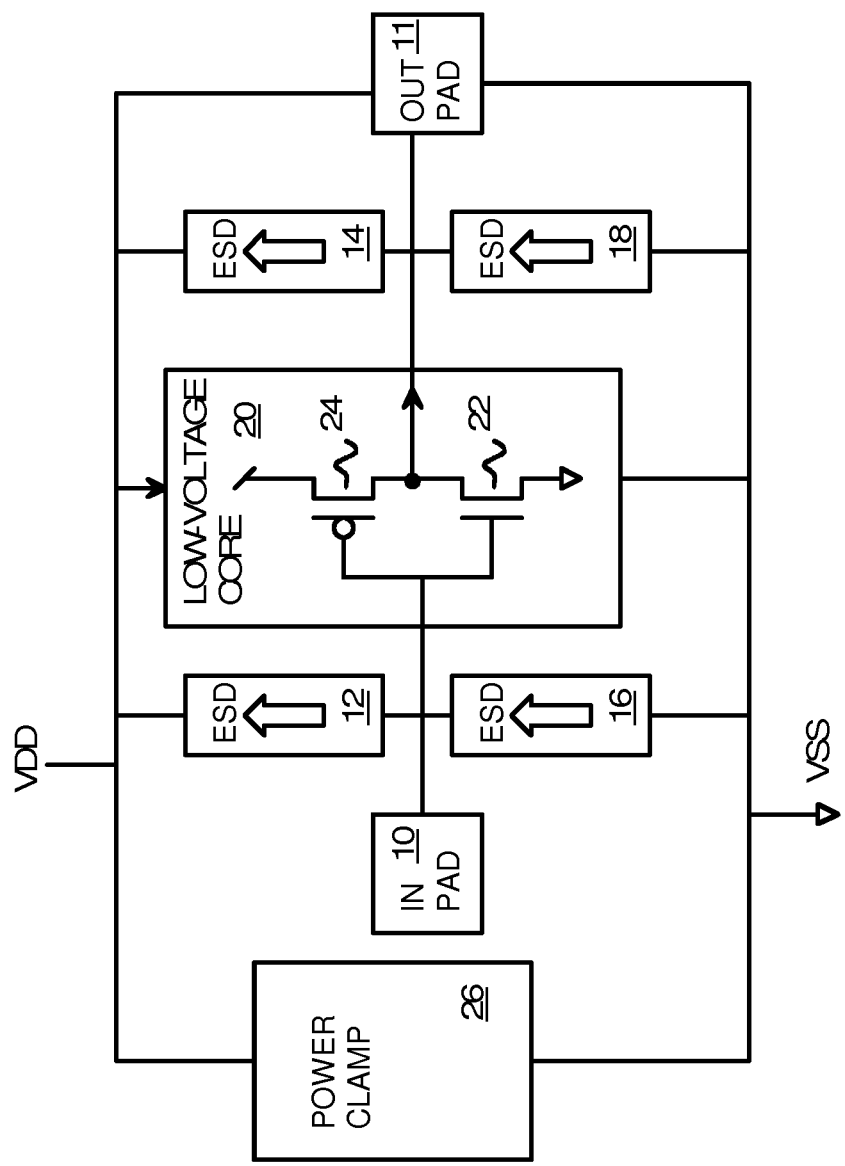
FIG. 1 shows a chip with several ESD-protection clamps.

Both thick oxide and thin oxide transistors may be protected by the power clamp and ESD protection devices. Alternately, several power clamps with different combinations of transistors and power-supply voltages may be used. Each pad may have only one ESD protection device, only two ESD protection devices, or four ESD protection devices as shown in FIG. 1. The anode and cathode (A and K) nodes may be reversed to swap the direction of protection.

Bias, VDD, and voltage values may vary somewhat due to process, temperature, and design variances. For example, the forward bias voltage may be 0.5 volt, +/−0.1 volt, the trigger voltage may be 4 volts, +/−0.5 volts, and the holding voltage may be 2 volts+/−0.5 volts. Other values are possible.

The snap-back breakdown voltage of triggering MOS transistor 54 may vary somewhat from low-voltage transistors in low-voltage core circuitry 20. For example, triggering MOS transistor 54 may have a slightly longer channel length or other features to harden it, while low-voltage transistors in low-voltage core circuitry 20 may use minimum channel lengths and dimensions. Snap-back voltages may vary with process, temperature, and exact geometries of the transistors. While descriptions of operation have been given based on a theoretical understanding of the physical processes, these theoretical descriptions may be incorrect. Second and third order effects may also be present. Various mechanisms may be responsible for breakdown and conduction under various conditions.

Large output driver transistors also act as large diodes for some ESD tests and conditions. For example, when the ESD pulse is applied across an I/O pad and the power-supply pad, a positive ESD pulse can turn on a parasitic p-n drain-substrate junction of the drain of the large p-channel driver transistor. The n-type substrate or well of the p-channel driver transistor is normally connected to the I/O power supply. Thus the p-n junction is forward biased by the positive ESD pulse. While output pads have been described, other connection technologies may be substituted, such as ball-grid-array (BGA), flip-chip, etc., and the term pads is considered to apply to all such balls, pads, landings, etc. that are for external connection.

Likewise, when the ESD pulse is applied across the I/O pad and the ground pad, a negative ESD pulse can turn on the parasitic n-p drain-substrate junction of the drain of the large n-channel driver transistor. The p-type substrate or well of the n-channel driver transistor is normally connected to the I/O ground. Thus the p-n junction is forward biased by the negative ESD pulse. Various cross-domain coupling paths and mechanisms may exist that couple ESD pulses applied to one power-supply domain to another power-supply domain.

The background of the invention section contains background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A hybrid electro-static-discharge (ESD) protection circuit comprising:
a first terminal and a second terminal that an ESD pulse is applied across during an ESD event;
a lateral diode connected between the first terminal and the second terminal;
a vertical Silicon-Controlled Rectifier (SCR) that surrounds the lateral diode, the vertical SCR sharing the first terminal with the lateral diode;
a deep well, under and surrounding the lateral diode, the deep well forming a layer of the vertical SCR;
a substrate under the deep well, the substrate forming another layer of the vertical SCR;
a source region in the substrate, the source region being outside the deep well, the source region connected to the second terminal, the source region forming a final layer of the vertical SCR;
wherein the lateral diode is surrounded by the vertical SCR and electrically connected in parallel with the vertical SCR between the first terminal and the second terminal.

2. The hybrid ESD protection circuit of claim 1 further comprising:
a shallow well, formed inside the deep well but having an opposite doping polarity, the shallow well forming a first layer of the vertical SCR.

3. The hybrid ESD protection circuit of claim 2 wherein the lateral diode is formed within the shallow well.

4. The hybrid ESD protection circuit of claim 2 further comprising:
a drain region formed at an edge of the deep well;
a triggering MOS transistor having the source region in the substrate as a source, and having the drain region as a drain, the triggering MOS transistor conducting current from the drain region to the source region during the ESD event.

5. The hybrid ESD protection circuit of claim 4 wherein the triggering MOS transistor further comprises:
a thin gate oxide formed between the source region and the drain region;
a gate over the gate oxide.

6. The hybrid ESD protection circuit of claim 5 wherein the gate is connected to the second terminal.

7. The hybrid ESD protection circuit of claim 4 further comprising:
a deep implant region formed under the drain region at the edge of the deep well, the deep implant region having an opposite doping of the deep well,
wherein the deep implant region has a same doping type as the substrate, the deep implant region effectively extending the substrate doping to under the drain region to decrease a trigger voltage of the triggering MOS transistor.

8. The hybrid ESD protection circuit of claim 4 wherein the lateral diode comprises:
a first tap region having a same doping polarity as the shallow well, the first tap region connected to the first terminal;
a second diode region, having an opposite doping polarity as the shallow well, the second diode region connected to the second terminal.

9. The hybrid ESD protection circuit of claim 8 wherein the first tap region is shaped to have at least four fingers;
wherein the second diode region comprises four regions located between the at least four fingers of the first tap region.

10. The hybrid ESD protection circuit of claim 9 wherein the second diode region comprises four annular regions located between the at least four fingers of the first tap region, each annular region having a center cut-out for the shallow well.

11. The hybrid ESD protection circuit of claim 8 wherein the first tap region is cross shaped and the second diode region comprises four box regions located at corners of the first tap region;
wherein the drain region comprises four drain regions for the four triggering MOS transistors;
wherein the triggering MOS transistor comprises four triggering MOS transistors;
wherein the drain region is located past an end of the first tap region without the second diode region between the drain region and the first tap region,
wherein the four triggering MOS transistors are located past ends of the first tap region without an intervening second diode region.

12. The hybrid ESD protection circuit of claim 11 wherein the source region comprises four source regions for the four triggering MOS transistors.

13. The hybrid ESD protection circuit of claim 11 wherein the source region comprises a ring that completely surrounds the deep well, and is the source region for the four triggering MOS transistors.

14. The hybrid ESD protection circuit of claim 8 wherein the first tap region is a P+ region;
wherein the second diode region is an N+ region;

wherein the drain region is an N+ region;
wherein the source region is an N+ region;
wherein the shallow well is a P-well;
wherein the deep well is an N-well;
wherein the substrate is P-type,
wherein the vertical SCR is a PNPN SCR;
wherein the lateral diode is a P-well-to-N+ diode.

15. The hybrid ESD protection circuit of claim 14 further comprising:
a P+ region formed adjacent to the drain region and extending across an edge of the deep well.

16. An integrated diode-Silicon-Controlled Rectifier (SCR) protection device comprising:
a deep N-well formed in a P-substrate;
a P-well formed within the deep N-well;
a P+ diode tap formed within the P-well, the P+ diode tap connected to an anode terminal;
a N+ diode region formed within the P-well and connected to a cathode terminal; and
an N+ region formed in the P-substrate outside of the deep N-well and connected to the cathode terminal;
wherein the P+ diode tap and the P-well and the N+ region form a pn diode that conducts current;
wherein the P+ diode tap, the P-well, the deep N-well, the P-substrate, and the N+ region form a PNPN SCR structure that conducts SCR current when triggered on by the pn diode conducting current.

17. The integrated diode SCR protection device of claim 16 further comprising:
an N+ drain region formed outside the P-well at a boundary of the deep N-well and the P-substrate;
a triggering MOS transistor having the N+ region as a source, the N+ drain region as a drain, and the P-substrate as a substrate, the triggering MOS transistor conducting current from the N+ drain region to the N+ region when the pn diode conducts current to charge the N+ drain region.

18. The integrated diode SCR protection device of claim 17 further comprising:
wherein the triggering MOS transistor comprises four triggering MOS transistors;
wherein the N+ drain region comprises four N+ drain regions;
wherein the P+ diode tap forms a shape having four arms and four ends;
wherein the N+ diode region comprises four N+ diode regions situated between the four arms without blocking current from the four ends from reaching the four N+ drain regions.

19. An input protection device comprising:
an input pad that is able to receive an electro-static-discharge (ESD) pulse;
a ground line that is connected to a ground during normal operation;
a P+ diode tap to a P-well, the P+ diode tap connected to the ground line;
a plurality of N+ diode regions formed in the P-well and between fingers of the P+ diode tap, the plurality of N+ diode regions connected to the input pad;
wherein a lateral diode current flows from the P+ diode tap to the plurality of N+ diode regions when an ESD pulse is applied between the ground line and the input pad;
a deep N-well formed within a P-substrate, wherein the P-well is formed within the deep N-well;
a plurality of N+ drain regions formed at a boundary of the deep N-well and the P-substrate, wherein the plurality of N+ drain regions are situated near ends of the fingers of the P+ diode tap wherein current from the ends of the P+ diode tap reaches the plurality of N+ drain regions and is not intercepted by the plurality of N+ diode regions; and
a plurality of N+ source regions formed in the P-substrate near the plurality of N+ drain regions, wherein a parasitic bipolar junction transistor current flows from the plurality of N+ drain regions to the plurality of N+ source regions when the ESD pulse is applied;
wherein the plurality of N+ source regions are connected to the input pad;
wherein the parasitic bipolar junction transistor current turns on a Silicon-Controlled Rectifier (SCR) to conduct a SCR current from the P+ diode tap to the P-well, to the deep N-well, through the P-substrate to the plurality of N+ source regions.

20. The input protection device of claim 19 further comprising:
a deep P+ implant region formed under the plurality of N+ drain regions, the deep P+ implant region reversing an effective polarity of the deep N-well under the plurality of N+ drain regions;
a plurality of thin gate oxide regions located between the plurality of N+ drain regions and the plurality of N+ source regions;
a plurality of gates formed over the plurality of thin gate oxide regions, wherein the plurality of gates are connected to the input pad or are floating.

* * * * *